(12) United States Patent
Baar et al.

(10) Patent No.: US 9,979,494 B2
(45) Date of Patent: May 22, 2018

(54) ELECTROMAGNETIC COMPATIBILITY TEST SYSTEM WITH FIXED AND MOBILE GROUND PLANES

(71) Applicant: DELPHI TECHNOLOGIES IP LIMITED, St. Michael (BB)

(72) Inventors: James C. Baar, Logansport, IN (US); Robert R. Bugher, Russiaville, IN (US); Chad M. Blueher, Cicero, IN (US); Jason L. Shahan, Russiaville, IN (US); Jason S. Landrum, Kokomo, IN (US)

(73) Assignee: DELPHI TECHNOLOGIES IP LIMITED (BB)

( * ) Notice: Subject to any disclaimer, the term of this patent is extended or adjusted under 35 U.S.C. 154(b) by 0 days. days.

(21) Appl. No.: 15/292,791

(22) Filed: Oct. 13, 2016

(65) Prior Publication Data

US 2018/0109332 A1   Apr. 19, 2018

(51) Int. Cl.
*G01R 29/10* (2006.01)
*H04B 17/10* (2015.01)
*H01Q 1/48* (2006.01)

(52) U.S. Cl.
CPC ............. *H04B 17/102* (2015.01); *H01Q 1/48* (2013.01)

(58) Field of Classification Search
None
See application file for complete search history.

(56) References Cited

U.S. PATENT DOCUMENTS

| | | | | |
|---|---|---|---|---|
| 6,037,782 A | * | 3/2000 | Pommerenke | G01R 29/0821 324/501 |
| 8,421,677 B2 | * | 4/2013 | Godard | G01R 29/0878 343/700 MS |
| 2012/0206305 A1 | * | 8/2012 | Doyle | G01R 29/10 343/703 |
| 2012/0217979 A1 | * | 8/2012 | Wang | G01R 29/0814 324/612 |
| 2012/0231745 A1 | * | 9/2012 | Gregg | H04B 17/29 455/67.12 |
| 2014/0184241 A1 | * | 7/2014 | Ho | G01R 29/0814 324/602 |

(Continued)

FOREIGN PATENT DOCUMENTS

JP            06289080        * 10/1994  ............. G01R 29/08

*Primary Examiner* — Trinh Dinh
(74) *Attorney, Agent, or Firm* — Joshua M. Haines

(57) ABSTRACT

A system for testing electromagnetic compatibility of electrical devices includes a plurality of mobile-ground-planes and a fixed-ground-plane. Each of the plurality of mobile-ground-planes is individually customizable to provide a test-fixture for testing a selected instance of an electrical device. The fixed-ground-plane is configured to receive an instance of the plurality of mobile-ground-planes to overlay the fixed-ground plane and form a direct electrical contact between a bottom-side of the instance of the plurality of mobile-ground-planes and a top-side of the fixed-ground-plane. Optionally, the system includes an air-nozzle used to generate an air-gap between the instance of the plurality of mobile-ground-planes and the fixed-ground-plane while the instance of the plurality of mobile-ground-planes is being placed onto the fixed-ground-plane when gas passes through the air-nozzle.

2 Claims, 3 Drawing Sheets

(56) References Cited

U.S. PATENT DOCUMENTS

2015/0042309 A1* 2/2015 Kurihara ............ G01R 29/0821
                                                    324/76.11
2015/0245464 A1* 8/2015 Kuganesan .......... H05K 1/0203
                                                    361/717

* cited by examiner

ELECTROMAGNETIC COMPATIBILITY TEST SYSTEM WITH FIXED AND MOBILE GROUND PLANES

TECHNICAL FIELD OF INVENTION

This disclosure generally relates to a system for testing electromagnetic compatibility of electrical devices, and more particularly relates to a system that includes a plurality of mobile-ground-planes, each individually customizable to provide a test-fixture for testing a selected instance of an electrical device, and a fixed-ground-plane configured to receive a mobile-ground-planes to overlay the fixed-ground plane and form a direct electrical contact between a bottom-side of the mobile-ground-planes and a top-side of the fixed-ground-plane.

BACKGROUND OF INVENTION

Electromagnetic compatibility testing of many electrical devices is performed with the device connected in a Test Setup circuit that simulates the end application. Test Setups are typically assembled onto a large stationary electrical ground plane built within a high value specialized testing area. The historical method for conducting these tests requires a complex Test Setup to be assembled onto the large stationary ground plane, debugged, tested and then disassembled and removed from the specialized testing area. Then the pieces are carted to the next test area where the whole process is repeated. Undesirably, the specialized testing equipment sits idle "waiting" during the assembly and disassembly time periods.

SUMMARY OF THE INVENTION

Described herein is an effective test system that provides for the assembly of test Setups away from the aforementioned specialized high value testing chamber and then quickly transport into the specialized chamber without disturbing the Test Setup. Such a quick changeover test system has long been desired but not realized. Size and weight of typical Test Setups as well as difficulty achieving a highly repeatable ground path are the reasons a quick changeover method has not been realized in this specialized field.

The test system described herein is an improved approach for off-loading the assembly and disassembly time of a test setup from high value specialized test equipment. In particular, the system is useful where electrical testing requires complex test setups to be positioned on a large stationary ground plane. Advantages of this system include the use of compressed air and a two piece ground-plane arrangement. The problems associated with "quick changeover" of a large, heavy test setups requiring a consistent ground-plane are solved by the two piece ground plane. One piece of the system is a fixed-ground-plane that is built around a stationary conductive sheet built into a specialized test area where the high-value, specialized test equipment is located. The other piece is mobile-ground-plane that is built around a transportable conductive sheet. When positioned correctly, the two pieces act as single unified ground plane because electrical contact is made over a large area as the mobile-ground-plane is positioned atop or overlays the fixed-ground-plane when the test is conducted. The electrical-device being tested is pre-mounted on the mobile-ground-plane at a location off-line, i.e. remote from the fixed-ground-plane, and can be quickly moved into a specific specialized test area where it is placed upon the fixed-ground-plane. The electrical-device tested is then tested, and then mobile-ground-plane with the electrical device tested can be quickly removed allowing another pre-assembled test setup to be moved to the specialized test area and tested without delay.

In accordance with one embodiment, a system for testing electromagnetic compatibility of electrical devices is provided. The system includes a plurality of mobile-ground-planes and a fixed-ground-plane. Each of the plurality of mobile-ground-planes is individually customizable to provide a test-fixture for testing a selected instance of an electrical device. The fixed-ground-plane is configured to receive an instance of the plurality of mobile-ground-planes to overlay the fixed-ground plane and form a direct electrical contact between a bottom-side of the instance of the plurality of mobile-ground-planes and a top-side of the fixed-ground-plane.

In another embodiment, the system includes an air-nozzle used to generate an air-gap between the instance of the plurality of mobile-ground-planes and the fixed-ground-plane while the instance of the plurality of mobile-ground-planes is being placed onto the fixed-ground-plane when gas passes through the air-nozzle.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
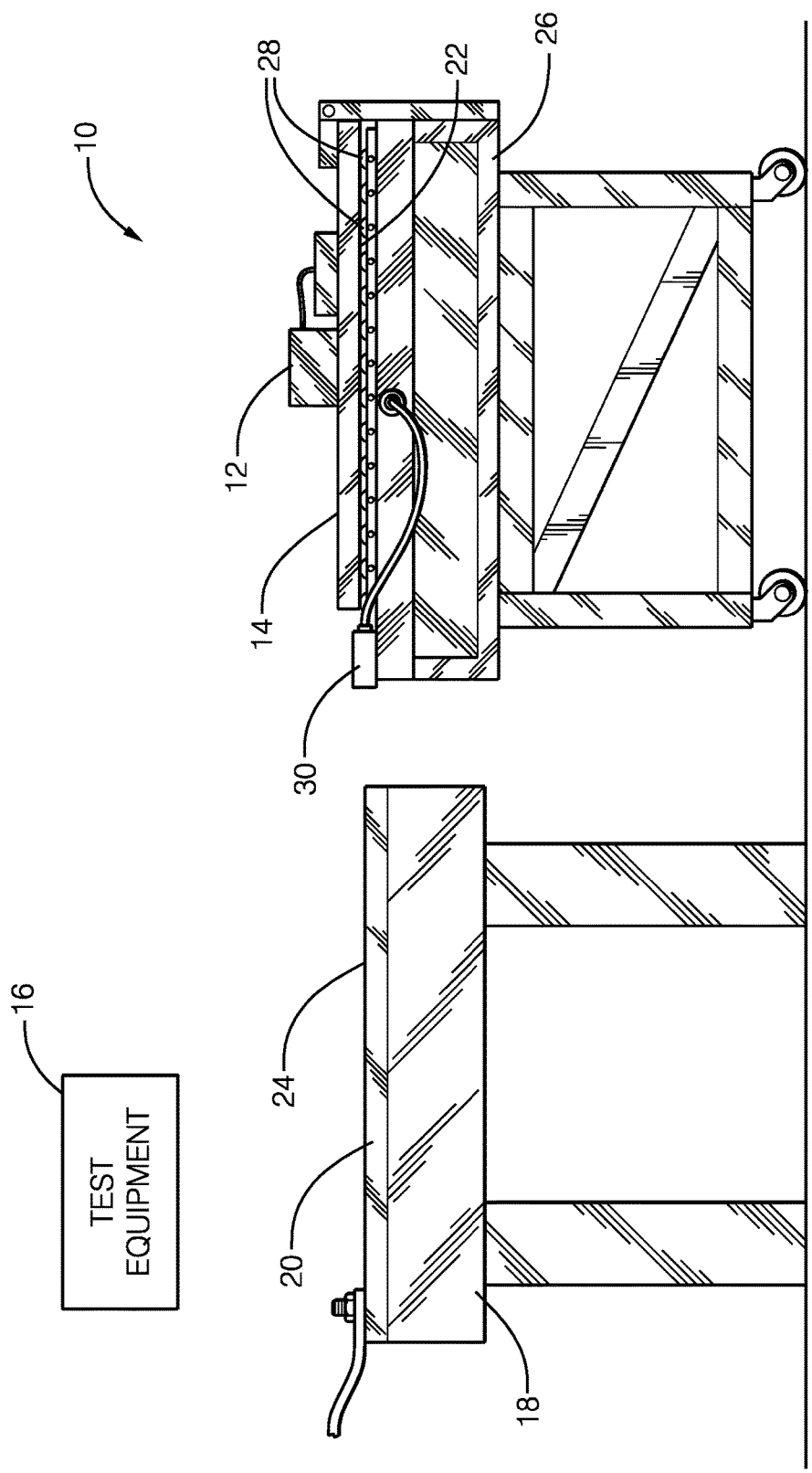
FIG. 1 is a side view of an electromagnetic test system in accordance with one embodiment.

FIG. 1 illustrates a non-limiting example of a system 10 for testing electromagnetic compatibility of electrical devices 12. The system 10 includes a plurality of mobile-ground-planes 14, only one of which is shown in FIG. 1 and is hereafter sometimes referred to as the mobile-ground-plane 14. By way of example and not limitation, each of the plurality of mobile-ground-planes 14 is preferably formed of copper sheet-metal with, for example, a thickness of two millimeters (2 mm), a depth (measured left to right in FIG. 1) of one meter (1 m) and a width (measured normal to FIG. 1) of two meters (2 m). It is recognized that other thicknesses, depths, and/or widths may be preferable based on the specific electromagnetic compatibility test being performed and/or the specific instance of electrical-device 12 being tested.

Advantageously, each of the mobile-ground-planes 14 is individually customizable to provide a test-fixture for testing a selected instance of the electrical device 12. By having multiple copies or instances of the mobile-ground-plane 14, the system 10 can make more efficient use of the expensive electrical test-equipment 16 that is associated with electromagnetic compatibility testing and is, in general, necessarily positioned on or proximate to, for example, a test bench 18. As will be recognized by those in the art, the test-bench 18 is typically formed of wood rather than metal so as to avoid introducing unknown effects or variations into the electromagnetic test.

The system 10 includes a fixed-ground-plane 20 positioned on top of the test-bench 18. The fixed-ground-plane 20, possibly in cooperation with the test-bench 18, is configured to receive an instance of the plurality of mobile-ground-planes 14 to overlay or lie atop the fixed-ground plane 20 and form a direct electrical contact between a bottom-side 22 of the instance of the plurality of mobile-ground-planes 14 and a top-side 24 of the fixed-ground-plane 20. The fixed-ground-plane 20 is also preferably formed of copper sheet-metal with the same thickness as the mobile-ground-plane 14; however this is not a requirement. It is noted that both the bottom-side 22 of the mobile-ground-plane 14 and the top-side 24 of the fixed-ground-plane 20 need to be free from protective coatings that could interfere with making electrical contact therebetween.

The desire is that the mobile-ground-plane 14 and the fixed-ground-plane 20 form an electrical contact over enough of the area of these two ground-planes so that the combination appears electrically to be a single unified ground-plane. That is, changing the test system from single ground-plane to the two ground-plane configuration of the system 10 described herein should not change the results of an electromagnetic test performed on the electrical-device 12. Initial testing has indicated that this is the case. However, a test maintenance program that includes regular cleaning of the bottom-side 22 of the mobile-ground-plane 14 and the top-side 24 of the fixed-ground-plane 20 is envisioned, possible along with periodic (e.g. annual) verification testing to show that the system 10 is equivalent to prior single ground-plane test systems that suffered from the inefficient time use of the test-equipment 16 as described above.

It is recognized that the rather large and heavy piece of copper sheet-metal used to form the mobile ground-plane 14 may be difficult for technicians to pick-up to move. Accordingly, the system 10 may include a cart 26, optionally equipped with castor-wheels 28 to allow the mobile-ground-plane 14 to easily roll, at least in one direction, across the top of the cart 26. The caster-wheel 28 may be single direction wheels, rotatable castors, or caged bearing-balls, as will be recognized by those in the art.

Figure 2:
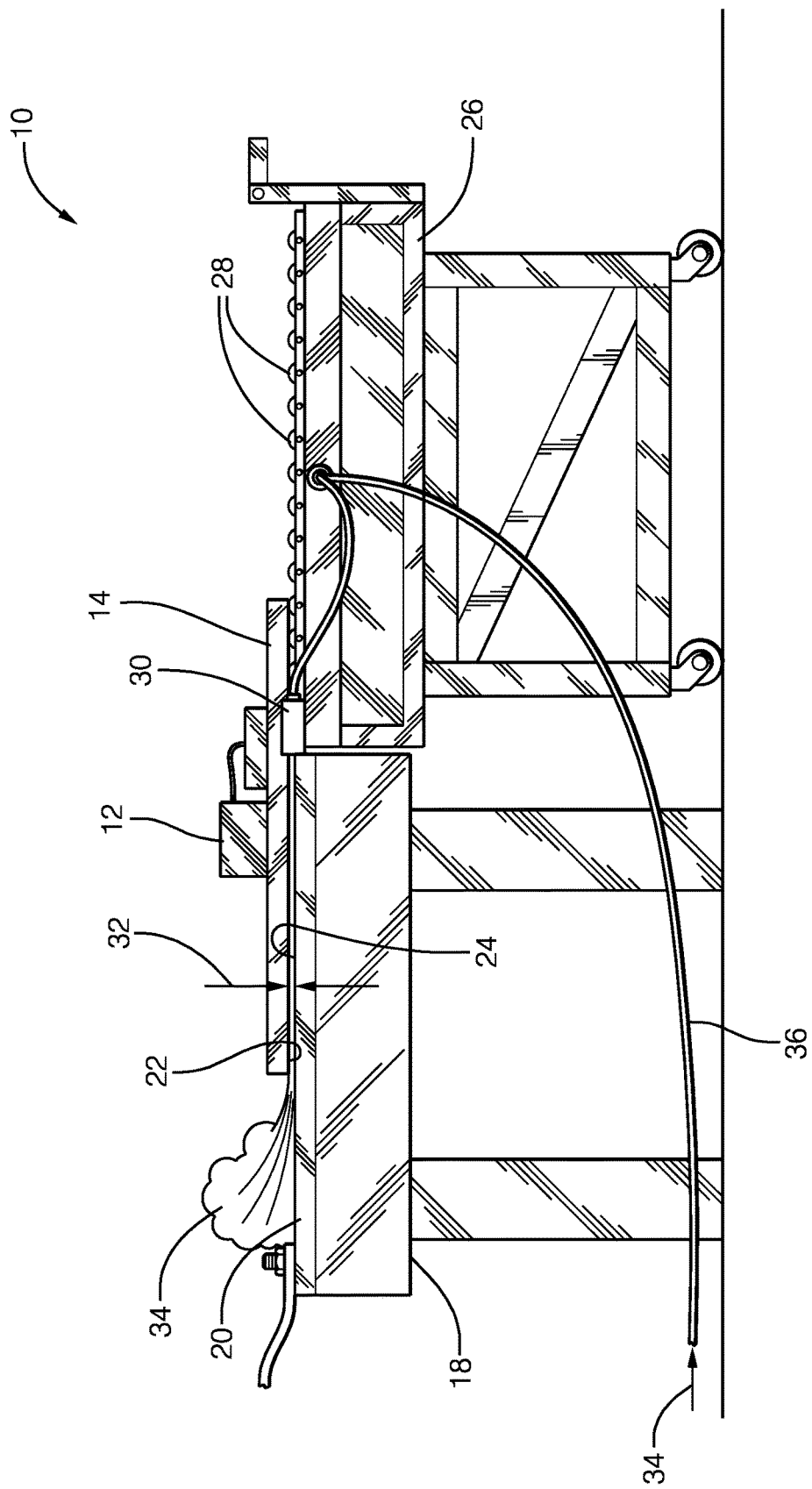
FIG. 2 is another side view of an electromagnetic test system in accordance with one embodiment.

FIG. 2 illustrates another non-limiting example of the system 10 where the cart 26 is moved close to the test-bench 18 so that the mobile-ground-plane 14 can be slid upon the fixed-ground-plane 20. It was recognized that friction between the bottom-side 22 of the mobile-ground-plane 14 and the top-side 24 of the fixed-ground-plane 20 could make it difficult to slide or move the mobile-ground-plane 14 onto the fixed-ground-plane 20. To alleviate this problem, the system 10 includes an air-nozzle 30 used to generate an air-gap 32 between the instance of the plurality of mobile-ground-planes 14 and the fixed-ground-plane 20 while the instance of the plurality of mobile-ground-planes 14 is being placed onto the fixed-ground-plane 20 when gas 34, e.g. air, passes through the air-nozzle 30. The air-nozzle 30 may be connected to an air-hose 36 that is connected to a supply of compressed air which is typically available in industrial situations. The air-nozzle 30 may be positioned slightly above the plane defined by the top-side 24 so that the air-gap 32 can be readily established as the mobile-ground-plane 14 transitions from being mostly on the cart 26 to being mostly on the fixed-ground-plane 20. That is, the air-nozzle 30 directs the gas 34 between the mobile-ground-plane 14 and the fixed-ground-plane 20, which escapes on the back-side of the mobile-ground-plane 14.

It is contemplated that the gas 34 will need to be clean, i.e. free from particles and/or oils commonly found in compressed air systems, so it is anticipated that a filter/oil remover (not shown) will be needed somewhere between the nozzle and the source of compressed air. The air-nozzle 30 is about the width of the mobile-ground-plane 14. If the air-nozzle 30 is substantially wider, compressed air will be wasted and it may be difficult to establish the air-gap 32 so that the mobile-ground-plane is easily moved across the fixed-ground-plane 20. Similarly, if width of the air-nozzle 30 is too short or small, the air-gap 32 will not be well established where air-nozzle 30 is not present, so it will be difficult to move the mobile-ground-plane 14. When the mobile-ground-plane 14 is moved onto the fixed-ground-plane 20 and the compressed air is removed, the mobile-ground-plane 14 makes an intimate and direct electrical contact with the fixed-ground-plane 20, whereby the two ground-planes function as a singular unified ground-plane.

Figure 3:
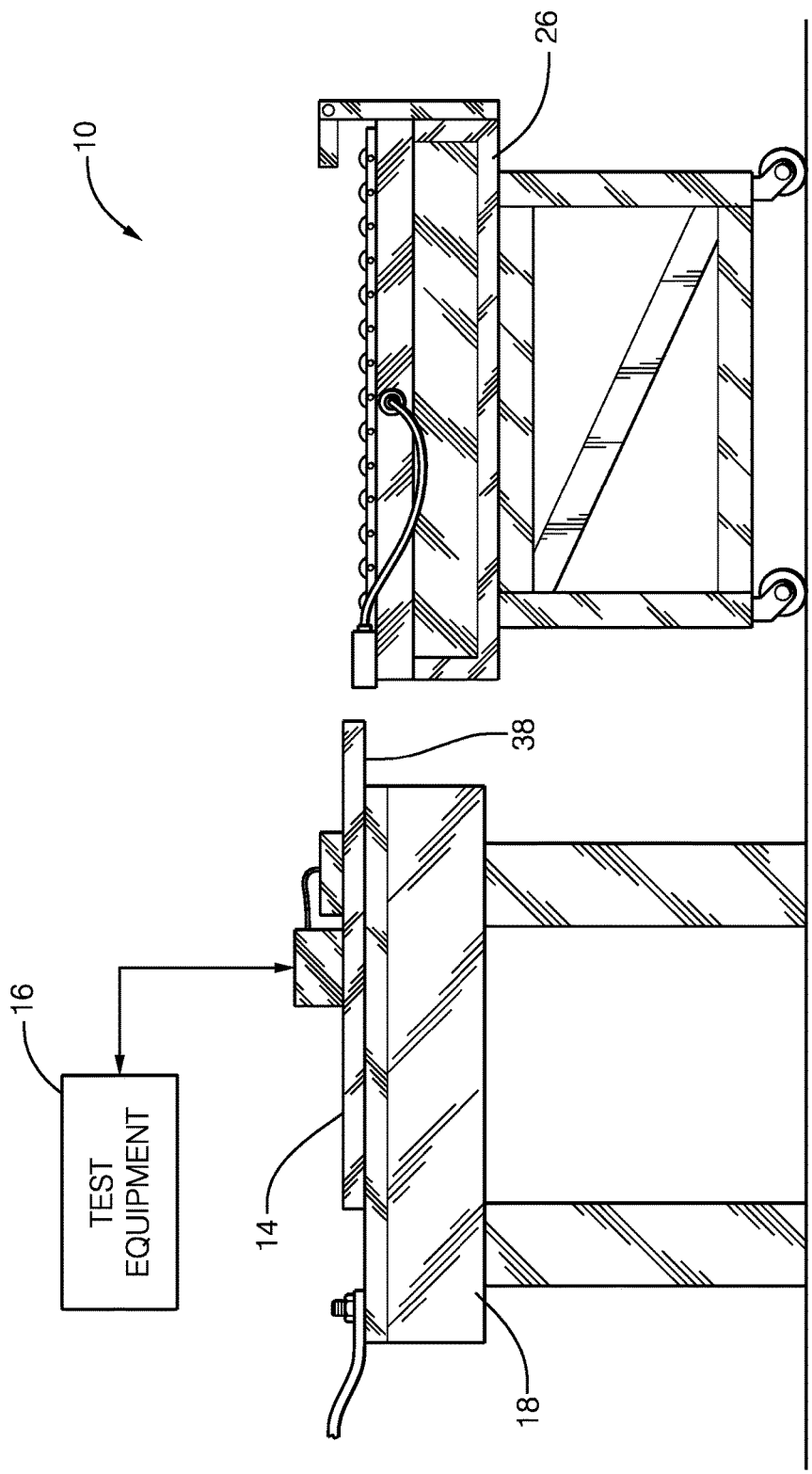
FIG. 3 is another side view of an electromagnetic test system in accordance with one embodiment.

FIG. 3 illustrates another non-limiting example of the system 10 where the cart 26 is moved away from the test-bench 18 after the mobile-ground-plane 14 has been transferred or slid upon the fixed-ground-plane 20. The mobile-ground-plane 14 is positioned so that an over-hang 38 of the mobile-ground-plane 14 is established so that later when testing is completed and the mobile-ground-plane 14 is to be removed from the fixed-ground-plane 20 the air-gap 32 can be re-established to ease the transfer of the mobile-ground-plane 14 back onto the cart 26. Also, electrical connections between the electrical-device 12 being tested and the test-equipment 16 can be readily made.

Accordingly, a system 10 for testing electromagnetic compatibility of electrical devices is provided. The system 10 provides for time-efficient use of expensive test equipment and facilities as the attachment of the electrical-device 12 to the mobile-ground-plane 14 and the arrangement of electrical-harness for making electrical connections to the electrical-device 12 can be made at a location remote from the test-equipment 16 while another instance of electrical device is being tested on one of the other instances of the plurality of mobile-ground-planes 14.

While this invention has been described in terms of the preferred embodiments thereof, it is not intended to be so limited, but rather only to the extent set forth in the claims that follow.

We claim:

1. A system for testing electromagnetic compatibility of electrical devices, said system comprising:
   a mobile-ground-plane, wherein the mobile-ground-plane is individually customizable to provide a test-fixture for testing a selected instance of an electrical device; and
   a fixed-ground-plane configured to receive an instance of the mobile-ground-plane to overlay the fixed-ground plane and form a direct electrical contact between a bottom-side of the instance of the mobile-ground-plane and a top-side of the fixed-ground-plane.

2. The system in accordance with claim 1, wherein the system includes an air-nozzle used to generate an air-gap between the instance of the mobile-ground-plane and the fixed-ground-plane while the instance of the mobile-ground-plane is being placed onto the fixed-ground-plane when gas passes through the air-nozzle.

* * * * *